United States Patent [19]

Shuster et al.

[11] 4,308,394
[45] Dec. 29, 1981

[54] ARYL-GLYOXYLOYLOXYALKYLACRYLATES

[75] Inventors: Karl-Ernst Shuster, Kerken; Hans Rudolph, Krefeld; Wolfram Mayer, Krefeld; Hans J. Rosenkranz, Krefeld, all of Fed. Rep. of Germany

[73] Assignee: Bayer Aktiengesellschaft, Leverkusen, Fed. Rep. of Germany

[21] Appl. No.: 46,941

[22] Filed: Jun. 8, 1979

[30] Foreign Application Priority Data

Jun. 14, 1978 [DE] Fed. Rep. of Germany ....... 2825955

[51] Int. Cl.³ .............................................. C07C 69/76
[52] U.S. Cl. .................................. 560/51; 204/159.23;
560/45; 560/47; 560/48; 560/49; 560/50;
560/53; 560/54
[58] Field of Search ....................... 560/51, 53, 54, 45,
560/48, 47, 49, 50; 260/952; 204/159.23

[56] References Cited
U.S. PATENT DOCUMENTS
3,930,868 1/1976 Muzyczko ............................ 560/51

Primary Examiner—Paul J. Killos
Attorney, Agent, or Firm—Connolly and Hutz

[57] ABSTRACT

Compounds added to initiate photopolymerization of monomers to produce polymeric coatings include compounds of the formula

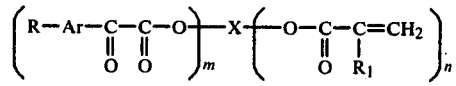

wherein
Ar is phenyl or naphthyl,
R is hydrogen, alkyl with 1–4 carbon atoms, alkoxy with 1–4 carbon atoms, halogen, dialkylamino with 1–4 carbon atoms in each alkyl group, carboxyl, or alkoxycarbonyl with 1–4 carbon atoms in the alkoxy group,
X is alkyl having 3 to 6 carbon atoms or alkyl having 6 to 72 carbon atoms interrupted by at least one member selected from the group consisting of

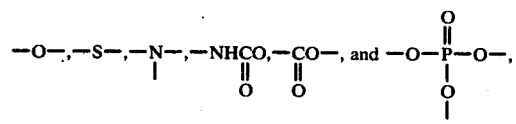

and the precursor of X being a polyol having 3 to 6 hydroxyls and having a hydroxyl number of from 100 to 1850,
$R_1$ is hydrogen or methyl,
n is a number with a value from about 2 to about 5, and
n+m is a number with a value from about 3 to about 6.

5 Claims, No Drawings

ARYL-GLYOXYLOYLOXYALKYLACRYLATES

This invention relates to new aryl-glyoxyloyloxyalkylacrylates and their use for the preparation of highly reactive photopolymerisable binders. These binders are thereby provided with a built-in photoinitiator which is non-yellowing and stable in storage in the dark and which requires no additional accelerator.

Binders based on polyacrylic acid esters which are hardened by UV light are generally provided with special initiators such as benzoin ethers, benzyl ketal or benzophenone/tertiary amine, etc. in quantities of up to 20% by weight, preferably from 1 to 5% by weight, based on the hardenable binder, for the purpose of effecting radical polymerisation. Such binders and the initiators used in them are known in the art and have frequently been described, e.g. in U.S. Pat. No. 4,014,771 and British Pat. Nos. 1.456.486 and 1.414.065.

Unfortunately, however, the major proportion (about 90% by weight) of the photoinitiator used does not undergo reaction during the hardening by UV light and can be extracted unchanged from the crosslinked film, as has been demonstrated by investigation carried out by J. I. Geary (Journal of Coatings Technology (49) 626, page 25, 1977).

Photopolymerisable binders of this kind which contain extractable or diffusible compounds obviously cannot be used in the food packaging sector.

It is, however, precisely for this field of application that it would be desirable to have a binder which combines the advantages of photopolymerisation with the properties required to meet the demands of food hygiene.

There has been no lack of attempts to develop initiators which can be chemically fixed by polymerisation. The products which have been described in the literature include, for example, acrylic acid benzoin esters (Barzynski, Chem. Zeitung 96 (1972), p. 545) and reaction products of benzophenone carboxylic acid derivatives and hydroxyethyl(meth)acrylate (see U.S. Pat. Nos. 4,004,998 and 4,126,527).

These compounds, however, are not suitable in practice because they are insufficiently reactive and/or insufficiently stable under conditions of storage in the dark.

U.S. Pat. No. 3,930,868 discloses the preparation of aryl-glyoxyloyl-oxyalkylacrylates which contain an aryl glyoxyloyl group and a (meth)acryloyl group joined through an alkylene dioxy group. These aryl-glyoxyloyloxyalkyl(meth)acrylates are used for the modification (e.g. by grafting) of relatively high molecular weight resins which carry saturated or still unsaturated groups, or they may be copolymerised with monomers in the presence of a catalyst to form relatively high molecular weight thermoplastic resins. When the resulting polymers containing light-sensitive aryl-glyoxyloyl groups are applied to a suitable substrate, areas exposed to light are converted into the insoluble state. The aryl-glyoxyloyl-oxyalkyl acrylates of the above mentioned U.S. patent are unsuitable for use as photoinitiators for unsaturated polyesters (=UP resins) and their reactivity leaves much to be desired for the photopolymerisation of acrylic resins.

Lastly, U.S. Pat. No. 4,038,164 discloses arylglyoxylic acid esters with 1 to 10 C-atoms in the alcohol group as photoinitiators for photopolymerisable monomers or for systems of unsaturated polymers and monomers. These photoinitiators, however, have the same disadvantages as those mentioned in U.S. Pat. No. 3,930,868.

It was an object of the present invention to provide means whereby UP resins, optionally as mixtures with photopolymerisable monomers or polyepoxide- or polyurethane-based resins carrying (meth)acryloyl groups, optionally in admixture with photopolymerisable monomers, could be rapidly hardened to form tack-free, solvent-resistant coatings with the aid of a suitable photoinitiator. The photoinitiator used should not give rise to any discoloured products and should no longer be removable by physical methods from the crosslinked coatings after photopolymerisation.

The problem was solved by developing special photoinitiators containing at least two (meth)acryloyloxy groups and at least one aryl-glyoxyloyloxy group joined through an trivalent to hexavalent saturated aliphatic hydrocarbon group X (in the following defined as alkyl having 3 to 72 carbon atoms) which may be interrupted by hetero atoms (when the alkyl group contain 6 to 72 carbon atoms) or heteroatomic groups.

Said X denotes an alkyl group with a valency of 3 to 6, preferably 3 or 4, in particular 3, of an aliphatic saturated alcohol (optionally interrupted by hetero atoms or heteroatomic group) with a valency of 3 to 6, preferably 3 or 4, in particular 3, which has been diminished by 3 to 6 hydroxyl groups, which alcohols have OH numbers of from 100 to 1850.

This invention thus provides a compound corresponding to the following general formula (I):

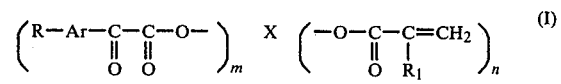

wherein
Ar is phenyl or naphthyl, preferably phenyl,
R is hydrogen, alkyl with 1-4 carbon atoms, alkoxy with 1-4 carbon atoms, halogen, preferably chlorine, dialkylamino with 1-4, preferably 1 or 2 carbon atoms in each alkyl group, carboxyl, or alkoxycarbonyl with 1-4 carbon atoms in the alkoxy group; in particular R=hydrogen;
X is alkyl having 3 to 6 carbon atoms or alkyl having 6 to 72 carbon atoms interrupted by at least one member selected from the group consisting of —O—, —S—,

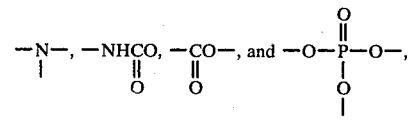

in particular —O—, and the precursor of X being a polyol having 3-6 hydroxyls and having a hydroxyl number from 100 to 1850
$R_1$ is hydrogen or methyl,
n is a number with a value from about 2 to about 5, preferably from about 2 to about 3, in particular about 2, and
n+m is a number with a value of from about 3 to about 6, preferably from 3 to about 4, in particular about 3.

From the formula (I) above and the definitions for X, n and n+m, it follows that every compound corresponding to the formula (I), regardless of the valency of the alcohol, contains at least two (meth)acryloyloxy and at least one aryl glyoxyloyloxy group.

It also follows that compounds derived from a tetravalent alcohol may still contain one, those derived from a pentavalent alcohol two and those derived from a hexavalent alcohol three free hydroxyl groups. When $n+m=4$ and $n=2$, the compound of formula (I) contains two arylglyoxyloyloxy groups and two acryloyloxy groups, and when $n+m=6$ and $n=2$ the compound contains four arylglyoxyloyloxy groups and two (meth)acryloyloxy groups.

Particularly preferred compounds of formula (I) are those corresponding to the following formula (II):

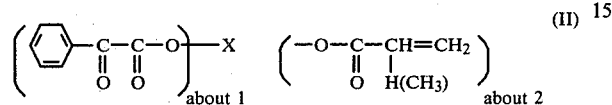

wherein X denotes the trimethylolpropane group minus the hydroxyl groups or an ethoxylated trimethylolpropane (about 3 to 12 mol ethylene oxide per mol trimethylol propane) group with an OH number of about 250 to about 600 minus the hydroxyl groups corresponding to formula (IIa) and (IIb)

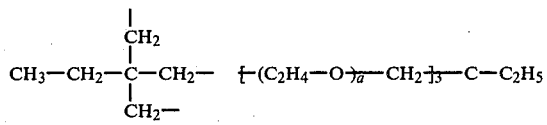

The aryl glyoxylic acids used for the preparation of the compounds of formula (I) are known and may be prepared by, for example, the process according to "Methoden der Organischen Chemie" Houben-Weyl Vol. VIII (1952), page 379, or U.S. Pat. No. 3,532,737 or Beilstein, Handbuch der Organischen Chemie, 4th Edition (1927), Vol. 10, pages 662, 663, 694, 695, 704, 713 and 745 or U.S. Pat. No. 3,065,259.

The groups X are derived from aliphatic saturated alcohols with valencies of 3 to 6 which may have OH numbers from about 100 to about 1850 (mg of KOH per gram of substance).

(A) The following are mentioned as examples: 1,1,1-trimethylolpropane($=$trimethylolpropane), glycerol, 1,1,1-trimethylolethane, 1,2,6-hexanetriol, pentaerythritol, dipentaerythritol, sorbitol, mannitol and the alkoxylation products of the above alcohols with 1 to 2, in particular 1 to 2 mol of 1,2-alkylene oxide per hydroxyl group. The 1,2-alkylene oxides may be for example, ethylene oxide, propylene oxide, butylene oxide or mixtures of two or more components.

Ethoxylation products of trimethylolpropane having OH numbers of from 250 to 600 and trimethylolpropane itself are particularly preferred.

The polyhydric alcohols may also contain other atoms or atomic groups apart from carbon, hydrogen and oxygen, e.g. the following:

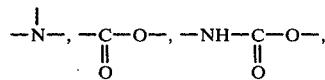

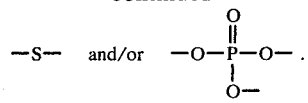

(B) The following are examples of suitable aliphatic alcohols with a valency of 3–6 containing nitrogen: Triethanolamine, triisopropanolamine, alkoxylation products of the above mentioned alcohols or of aliphatic amino compounds having 3–6 active amino hydrogen atoms with 1,2-alkylene oxides. Amino compounds of this type include, for example, polyamines such as ethylene diamine, diethylene triamine, triethylene tetramine, tetramethylene diamine, hexamethylene diamine, dihydroxy-tert.-butylamine and trihydroxy-tert.-butylamine, or ether amines such as diaminodialkyl ether and polyalkylene glycol polyether diamines and triamines (e.g. $H_2N$-[alkylene-O]$_x$alkylene-$NH_2$, $x=3$–$10$).

(C) Aliphatic alcohols with valencies of 3–6 containing oxycarbonylamino groups (—O—CO—NH—) may be obtained from aliphatic alcohols with valencies of 4 to 6 by reaction with aliphatic monoisocyanates or from at least trivalent alcohols or ether alcohols, or alcohols or ether alcohols containing tertiary nitrogen or thio groups by reaction with aliphatic diisocyanates. The isocyanates may also be reaction products of glycols, polyether glycols, polyester ether glycols or thioether glycols with aliphatic di- and polyisocyanates used in excess in relation to the hydroxyl groups. If the isocyanates obtained in this way have at least three isocyanate groups per molecule, dihydric alcohols, optionally containing —S—,

or —O—, may also be used for preparing the trihydric to hexahydric alcohols containing oxycarbonylamino groups.

(D) Alkoxylation products of orthophosphoric acid and 3–30, preferably 3–6 mol of 1,2-alkylene oxides, in particular ethylene oxide, per mol of orthophosphoric acid may also be used as trihydric alcohols for the preparation of the compounds according to the invention.

(E) The saturated aliphatic alcohols with valencies of 3–6 forming the basis of the group X may also be esterification products of the 3- to 6-valent alcohols or ether alcohols mentioned under (A) with aliphatic mono-, di-, tri- or tetracarboxylic acids, which in turn may still contain hydroxyl groups. In such cases, monocarboxylic acids which contain no hydroxyl groups may, of course, only be reacted with polyols and polyether polyols of the kind and in such quantities that the end product contains from 3–6 OH groups. The following are examples of suitable acids: Acetic acid, propionic acid, glycollic acid, glyceric acid, citric acid, tartaric acid, mucic acid, succinic acid, glutaric acid, adipic acid, thio-bis-acetic acid.

(F) Alcohols with valencies of 3–6 suitable for the purpose of the invention may also be obtained by the alkoxylation of thio-alcohols such as thioglycerol and of aminocarboxylic acids such as aminoacetic acid, 3-aminopropionic acid or 4-aminobutyric acid, citric acid, tartaric acid, glycericacid or mucic acid (alkoxylation of the thio, amino and carboxyl group and optionally the hydroxyl group).

The compounds corresponding to the general formula (I) are prepared by known methods of esterification. Although it would theoretically be possible to obtain compounds of the formula (I) by reaction of the acid chlorides and acid anhydrides of arylglyoxylic acid and acrylic acid in the presence of suitable catalysts such as tertiary amines or by reaction of the esters (such as the methyl and ethyl esters) of arylglyoxylic and (meth)acrylic acid in the presence of organometallic compounds such as titanium tetralkylates or aluminium alcoholates or alkali metal alcoholates as catalysts with the alcohols of valency 3 to 6, the esterification is preferably carried out by direct esterification of the arylglyoxylic acids or (meth)acrylic acid with the 3- to 6-valent alcohols in the presence of catalytic quantities of mineral acids or of organic sulphonic acids such as p-toluenesulphonic acid. The procedure may be arranged so that the end product is obtained in two stages, i.e. esterification or trans-esterification with (meth)acrylic or aryl glyoxylic acid is first carried out, followed by a reaction with the still missing component. On the other hand, according to a preferred embodiment, the reaction may be carried out as a one pot process in which all the components of the reaction are reacted together at the same time. The esterification is preferably carried out at temperatures of from 60° to 150° C.

Esterification may be carried out with or without inert solvents such as benzene, toluene, xylene, chlorobenzene, n-hexane, cyclohexane, methylene chloride, chloroform, etc.

A preferred embodiment is the azeotropic esterification with toluene as carrier and p-toluenesulphonic acid as catalyst.

The quantities of arylglyoxylic acid and (meth)acrylic acid to be used depend on the valency of the alcohol and the desired end product. The only necessary condition is that the end product of formula (I) should always be polyfunctional (at least about difunctional) in relation to the (meth)acryloyloxy groups and at the same time at least monofunctional in relation to the arylglyoxyloyloxy groups. It follows that trivalent alcohols (1 mol) will always be esterified with approximately 2 mol of (meth)acrylic acid and approximately 1 mol of aryglyoxylic acid. In the case of tetravalent alcohols, approximately 2 to 3 mol of (meth)acrylic acid and approximately 1 to 2 mol of arylglyoxylic acid may be used per mol of alcohol. Pentavalent alcohols (1 mol) may be esterified with approximately 2 to 4 mol of (meth)acrylic acid and approximately 1 to 3 mol of arylglyoxylic acid while hexavalent alcohols may be esterified with approximately 2 to 5 mol of (meth)acrylic acid and approximately 1 to 4 mol of arylglyoxylic acid.

It is advisable to add from 0.001 to 0.15% by weight, based on the total mixture, of the polymerisation inhibitors or antioxidants during preparation of the product so that they are already present in order to protect the polymerisable reaction products according to the invention against unwanted premature polymerisation.

Suitable auxiliary agents of this type include, for example, phenols and phenol derivatives, preferably sterically hindered phenols containing alkyl substituents with 1 to 6 C-atoms in both ortho-positions to the phenolic hydroxyl group, amines, preferably secondary arylamines and their derivatives, and quinones.

The following are specific examples: 4,4'-Bis-(2,6-di-tert.-butyl-phenol); 1,3,5-trimethyl-2,4,6-tris(3,5-di-tert.-butyl-4-hydroxyl-benzyl)-benzene; 4,4'-butylidene-bis-(6-tert.-butyl-m-cresol); 3,5-di-tert.-butyl-4-hydroxybenzyl-phosphoric acid diethyl ester; N,N'-bis-($\beta$-naphthyl)-p-phenylenediamine; N,N'-bis-(1-methyl-heptyl)-p-phenylenediamine; phenyl-$\beta$-naphthylamine; 4,4'-bis-($\alpha,\alpha$-dimethylbenzyl)-diphenylamine; 1,3,5-tris-3,5-di-tert.-butyl-4-hydroxy-hydroquinamoyl)-hexahydro-s-triazine; hydroquinone; p-benzoquinone; 2,5-di-tert.-butyl-quinone; toluhydroquinone; p-tert.-butyl-pyrocatechol; 3-methyl-pyrocatechol; 4-ethyl-pyrocatechol; chloranil; naphthoquinone; phenothiazine; and 2,5-di-tert.-butyl-hydroquinone.

Other suitable stabilizers are described in "Methoden der Organischen Chemie" (Houben-Weyl), 4th Edition, Volume XIV/1, pages 433–452, Georg Thieme Verlag, Stuttgart, 1961. A very suitable stabilizer, for example, is 2,5-di-tert.-butyl-hydroquinone, or toluhydroquinone used in a concentration of from 0.001 to 0.15% by weight, based on the whole polymerisable mixture.

This invention also relates to the use of the compounds of formula (I) as initiators for the photopolymerisation of olefinically unsaturated photopolymerisable monomeric or oligomeric compounds (resins) or mixtures thereof.

The photopolymerisable mixtures, which may be used as binders in coatings and printing inks, are also a subject of the present invention.

The photopolymerisable binders mentioned above are mixtures of (A) 20–95% by weight of at least one photopolymerisable resin from the group comprising 1,2-polyepoxides, polyesters and polyurethanes which contain more than one olefinically unsaturated C—C double bond;

(B) 0–75% by weight of at least one acrylic or methacrylic acid ester of monohydric to tetrahydric alcohols or styrene or mixtures thereof, and (C) 5–80% by weight of at least one photoinitiator, characterised in that the mixture contains at least one compound of the general formula (I) as photoinitiator.

The mixtures preferably contain, as component (A), olefinically unsaturated 1,2-polyepoxides and polyurethanes which have C—C double bonds, i.e. 1,2-polyepoxy(meth)acrylates and polyurethane(meth)acrylates. The epoxide groups in the polyepoxides and the polyurethanes containing hydroxyl groups have been completely or partly (at least 60% thereof) esterified with acrylic or methacrylic acid. The polyesters contain the unsaturated groups, preferably in the form of 2-butenedioyl-dioxy groups, —O—CO—CH=CH—CO—O— (cis- and trans).

The resins mentioned under (A) above are known, as are also mixtures thereof with component (B). Mixtures of this kind have already been hardened with conventional photoinitiators.

The polyepoxy(meth)acrylates which are present as components of the mixture in the binders according to the invention have already been described, for example, in U.S. Pat. No. 4,014,771, British Pat. No. 1,456,486, and U.S. Pat. Nos. 4,049,745 and 4,081,492. They are reaction products of 1,2-polyepoxides containing more than one 1,2-epoxide group per molecule and acrylic or methacrylic acid, obtained by a reaction using approximately 0.6 to 1 mol of (meth)acrylic acid to one epoxide group. Polyepoxides of polyphenols, in particular bisphenol A, are particularly preferred. The polyepoxides may have been modified with ammonia or aliphatic or cycloaliphatic primary or secondary amines before their reaction with acrylic or methacrylic acid and may have been reacted with a saturated aliphatic carboxylic acid after their reaction with (meth)acrylic acid. Furthermore, the polyepoxides may first be partly lengthened with hydrogen sulphide, dithiols or polythiols and then converted into polyepoxy(meth)acrylates by a reaction with acrylic or methacrylic acid. Details concerning this may be found in the literature mentioned above, which also discloses mixtures of polyepoxy (meth)acrylates with monofunctional and polyfunctional acrylic or methacrylic acid esters.

Polyurethane(meth)acrylate resins have been described for example in U.S. Pat. Nos. 3,297,745, 3,509,234 and 3,782,961 and British Pat. Nos. 1,321,372 and 1,537,909.

Unsaturated polyesters (UP resins) have also long been known, for example from British Pat. Nos. 810,222; 1,488,489 and 1,414,065 and Kunststoff-Handbuch Volume III, Polyester, pages 247–312 (1973), publishers Carl Hunser, Munich.

The aryl-glyoxyloyl-oxyalkyl(meth)acrylates corresponding to the general formula (I) may, as already mentioned above, also be used for the photopolymerisation of olefinically unsaturated monomers.

The following are examples of such monomers:

(1) Esters of acrylic or methacrylic acid with aliphatic $C_1-C_8$, cycloaliphatic $C_5-C_6$ or araliphatic $C_7-C_8$ monohydric alcohols, for example methyl acrylate, ethyl acrylate, n-butyl acrylate, methylhexyl acrylate, 2-ethylhexyl acrylate and the corresponding methacrylic acid esters; cyclopentyl acrylate; cyclohexyl acrylate or the corresponding methacrylic acid esters; benzyl acrylate, β-phenylethyl acrylate and the corresponding methacrylic acid esters;

(2) Hydroxyalkyl esters of acrylic or methacrylic acid having 2–4 C-atoms in the alcohol component, such as hydroxyethyl acrylate, 2-hydroxypropyl acrylate, 3-hydroxypropyl acrylate, 2-hydroxybutyl acrylate, 3-hydroxybutyl acrylate or the corresponding methacrylic acid esters;

(3) Di- and polyacrylates and di- and polymethacrylates of glycols with 2 to 6 C-atoms and polyols with 3 to 4 hydroxyl groups and 3 to 6 C-atoms, such as ethylene glycol diacrylate, propanediol-1,3-diacrylate, butanediol-1,4-diacrylate, hexanediol-1,6-diacrylate, trimethylolpropane-triacrylate, pentaerythritol-triacrylate and -tetraacrylate and the corresponding methacrylates; also di-(meth)acrylates of polyether glycols of glycol, propanediol-1,3 and butanediol-1,4; trimethylolpropane and pentaerythritol;

(4) N-methylolacrylamide or N-methylolmethacrylamide and the corresponding N-methylolalkylethers having 1 to 4 C-atoms in the alkylether group and the corresponding N-methylolallylethers, in particular N-methoxymethyl (meth)acrylamide, N-butoxymethyl(meth)acrylamide and N-allyloxymethyl(meth)acrylamide; and (5) Styrene and divinylbenzene.

Mixtures of one or more of the above mentioned monomers may also be used.

The monomers of groups (1), (3) and styrene are preferably used as component B for mixing with component (A) in the photopolymerisable binders according to the invention.

Although it is preferred to use the binders according to the invention in solvent-free coatings which are hardened by UV light, they can be adjusted to a suitable viscosity by mixing them with inert solvents such as butyl acetate, ethyl acetate, acetone, ethyl methyl ketone, diethyl ketone, cyclohexane, cyclohexanone, cyclopentane, cyclopentanone, n-heptane, n-hexane, n-octane, isooctane, methylene chloride, chloroform, 1,1-dichloroethane, 1,2-dichloroethane, 1,1,2-trichloroethane or carbon tetrachloride. From 5 to 50% by weight, preferably from 20 to 40% by weight, of solvents, based on the mixture of reaction products according to the invention and solvent, may be added in order to obtain such a viscosity suitable for processing.

When making this adjustment, care should be taken to ensure that, in a complete lacquer formulation, the proportion of comonomeric photoinitiator according to the invention is such that the coating composition has sufficient reactivity, i.e. at least 0.02 mol of arylglyoxylic acid per 100 g of binder.

The sources of radiation used for carrying out photopolymerisation may be artificial sources emitting in the range of 2500 to 5000 Å, preferably 3000 to 4000 Å. Mercury vapour lamps, xenon lamps and tungsten lamps are suitable, especially high pressure mercury lamps.

Layers of the reaction products according to the invention having a thickness of from 1 μm to 0.1 mm (1 μm = $10^{-3}$ mm) can generally be hardened to a film in less than one second when exposed to the light of a high pressure mercury lamp, for example a Philips HTQ-7 lamp, from a distance of about 8 cm.

If fillers are added when the resin compounds according to the invention are used as coatings hardened by UV light, their choice is limited to those which do not suppress polymerisation by their absorption properties. Thus, for example, talcum, heavy spar, chalk, gypsum, silicates, asbestos powder and light spar may be used as fillers which are permeable to light, and $TiO_2$ and other colour pigments may also be used in very thin layers.

Application of the coatings to suitable substrates may be carried out by the usual methods employed in the lacquer industry, such as spraying, application with rollers, application with doctor wipers, printing, immersion, flooding, spread coating and brushing.

Suitable substrates are: Paper, cardboard, leather, wood, synthetic resins, textiles, ceramic materials and metals, paper and cardboard being particularly suitable. Since the coating compositions harden to films with excellent mechanical properties when exposed to UV light for only fractions of a second, it is possible, for example, to adapt a paper coating process to the usual production rates employed in the printing industry.

The percentages and parts given in the Examples are percentages and parts by weight unless otherwise indicated.

EXAMPLE 1

Preparation of an initiator according to the invention 100 g of an ethoxylated trimethylolpropane (OH number 550 = 0.98 OH equivalents per 100 g), 50 g of phenylglyoxylic acid (⅓ mol) and 43 g of acrylic acid (about 0.6 mol) are dissolved in 300 ml of toluene. 4.3 g of p-toluenesulphonic acid and 0.2 g of toluhydroquinone are added and azeotropic esterification is carried out (at 110° to 115° C.) while a stream of air is passed through until the reaction mixture has an acid number of 5.

The toluene is then distilled off under vacuum and the last traces of toluene and other volatile constituents are removed by passing air through the reaction mixture and at the same time heating it to 100° C./30 mbar for 2 hours.

A pale liquid with a viscosity of 800 mPa.sec./20° C. is obtained. On the basis of its IR spectrum, elemental analysis and determination of the saponification number, iodine number and molecular weight, it is identified as a compound corresponding to the following formula:

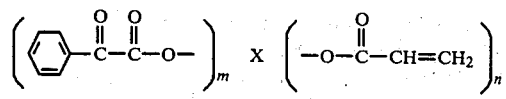

wherein m is approximately 1, n is approximately 2 and X represents the residue of an ethoxylated trimethylolpropane (OH number 550) minus the hydroxyl groups.

EXAMPLE 2

Preparation of a comparison initiator (corresponding to U.S. Pat. No. 3,930,868)

170 g of phenylglyoxylic acid chloride are reacted with 120 g of hydroxyethylacrylate in 400 ml of diethyl ether. 80 g of triethylamine in 300 ml of ether are then added dropwise. After termination of the reaction, the reaction mixture is left to stand overnight, washed with water until neutral, dried, stabilized with 0.1 g of toluhydroquinone and filtered over $SiO_2$ and the ether is then distilled off. A light coloured liquid (phenylglyoxyloyl-oxyethylacrylate) having a viscosity of 200 mPa.-sec./20° C. is obtained.

EXAMPLE 3

Preparation of a comparison initiator (corresponding to U.S. Pat. No. 4,038,164

150 g of phenylglyoxylic acid are reacted with 40 g of methanol to produce the methyl ester of phenylglyoxylic acid in the usual manner. $Bp_{0.9}$ mm 80°–82° C., $n_D^{20}$: 1.5294.

EXAMPLES 4–6

Preparation of photopolymerisable resins (Component A)

EXAMPLE 4

An unsaturated polyester if prepared in the usual manner by solvent-free condensation at 160° to 180° C. of 2320 g of fumaric acid, 451 g of propylene glycol, 1440 g of diethylene glycol, 940 g of trimethylolpropane diallyl ether and 430 g of diethylene glycol monobutyl ether. The polyester resin is dissolved in styrene to form a 69% solution.

EXAMPLE 5

340 g of a bisphenol A-bisglycidylether (epoxy equivalent weight 190) are reacted with 13 g of diethanolamine and 8 g of ethanolamine at 30° C. for 3 hours. 80 g of acrylic acid are then added at 60° C. until the acid number of the reaction mixture is zero (total about 8 hours). The product is mixed with 400 g of a triacrylate of an ethoxylated trimethylolpropane having an OH number of 550.

EXAMPLE 6

A urethane acrylate is prepared within 6 hours at 40° C. by the reaction of 417 g of tolylene diisocyanate with 36 g of thiodiglycol and 670 g of an ethoxylated trimethylolpropane (OH number 250) and finally with 220 g of 2-hydroxyethyl acrylate. The urethane acrylate is mixed with 300 g of a triacrylate of an etoxylated trimethylol propane (OH number 550).

Comparison of the initiators according to Examples 1–3

In order to obtain a clear comparison, the initiators of Examples 1 to 3 were mixed with the binders of Examples 4 to 6 in such proportions that the resulting concentration of initiator in the binders was 0.03 mol %, based on the phenyl-glyoxyloyloxy group. The quantities used in the individual examples are shown in Table 1, based in each case on 100 g of UV-hardenable mixture.

TABLE 1

| Prepared mixtures | | | |
|---|---|---|---|
| Mixture | A | B | C |
| 18 g of initiator according to Examples | 1 | 1 | 1 |
| 82 g of resin according to Examples | 4 | 5 | 6 |
| Mixture | D | E | F |
| 7.5 g of initiator according to Examples | 2 | 2 | 2 |
| 92.5 g of resin according to Examples | 4 | 5 | 6 |
| Mixture | G | H | I |
| 5.3 g of initiator according to Examples | 3 | 3 | 3 |
| 94.7 g of resin according to Examples | 4 | 5 | 6 |

In each of the groups A, D, G; B, E, H; and C, F, I, the reactivities of the three members of the group were compared with each other.

Comparison A, D, G

Each of the mixtures A, D and G was drawn out on a glass plate to form a film 500 μm in thickness, which was then exposed to a TL-AK 40 actinic strip light (Philips).

Results:

Mixtures A had hardened to a tack-free and dust-dry film after 15 minutes. Mixtures D and G showed no signs of polymerisation at the end of this time and the films were wet.

If folflows that only the initiator according to the invention (in mixture A) is active in styrolised UP resins while the other phenylglyoxylic acid derivatives show no tendency to polymerisation.

Comparison of Mixtures B, E, H and C, F, I

The mixtures were tested as follows:

A 20 μm thick film was drawn on white paper in each case, using a spiral doctor wiper. A Hanovia lamp (80 Watt/cm radiant power) placed at a distance of 10 cm was used for hardening on a conveyor belt designed to move at an adjustable velocity. The velocity of the belt in m/min until complete hardening is achieved (tack-free and solvent-resistant) is a measure of the differing reactivities:

TABLE 2

Composition employed and examination of the reactivity

| Mixture | Reactivity (m/min) |
| --- | --- |
| B according to the invention | 35 |
| E comparison | 20 |
| H comparison | 20 |
| C according to the invention | 25 |
| F comparison | 10 |
| I comparison | 10 |

EXAMPLE 7

A photoinitiator which can be chemically fixed is prepared at 110° to 120° C. by azeotropic esterification of 134 g of trimethylolpropane (1 mol) with 140 g of acrylic acid (1.94 mol) and 150 g of phenylglyoxylic acid (1 mol) in 500 ml of toluene as a carrier, 0.4 g of toluhydroquinone as a stabilizer and 4 g of p-toluene sulphonic acid as a catalyst. After termination of the reaction (8 hours), the reaction mixture is worked up as described in Example 1. A resinous product having a viscosity of 2 Pa.sec/20° C. and an acid number of below 5 is obtained. On the basis of the IR spectrum, elemental analysis, saponification number and molecular weight, the formula of the monophenylglyoxylic acid/diacrylic acid ester of trimethylolpropane may be attributed to the compound, i.e. in the general formula (I) given in the text, n is approximately 2, m is approximately 1 and X is the trimethylolpropane group minus the hydroxyl groups.

EXAMPLE 8

670 g (=2.99 OH equivalents in gram) of an ethoxylated trimethylol propane (OH number 250) are reacted with 140 g of acrylic acid (1.94 mol) and 150 g of phenylglyoxylic acid (1 mol) and worked up, employing a procedure analogous to that of Example 7. The resulting liquid has a viscosity of 400 mPa.sec/20° C. and an acid number of below 5. The compound corresponds to the general formula (I) In which n is approximately 2, m is approximately 1 and X is the residue of an ethoxylated trimethylolpropane of OH number 250 minus the OH groups.

EXAMPLE 9

85 g of the resin from Example 5 are mixed with 15 g of the initiator according to the invention described in Example 7 and the mixture is then hardened as a 20 μm film on white paper as described above. The results are shown in Table 3.

EXAMPLE 10

70 g of the resin from Example 5 are mixed with 30 g of the initiator according to the invention described in Example 8 and this mixture is also hardened as a 20 μm film on white paper as described. The results are shown in Table 3.

TABLE 3

Reactivity of initiators according to the invention

| Example | Reactivity (m/min) |
| --- | --- |
| 9 | 35 |
| 10 | 30 |

EXAMPLE 11

725 g of a propoxylated sorbitol (OH number 450) are azeotropically esterified with 150 g of phenylglyoxylic acid (1 mol) and 150 g of acrylic acid (2.09 mol) as in Example 1 and worked up.

The resulting product has a viscosity of 12 Pas, an OH number of 170 and an acid number of 3.

As a self-cross-linking binder, the compound of Example 1 in the form of a 20 μm film on paper attains a reactivity of 15 m/min under the conditions described above.

EXAMPLE 12

354 g of tolylene diisocyanate are reacted with 220 g of hydroxyethyl acrylate and 0.2 ml of tin octoate. When the isocyanate value reaches 15.8%, the mixture is reacted with 36 g of thiodiglycol, 400 g of an ethoxylated trimethylolpropane (OH number 250) and 400 g of the compound according to Example 11. A self-cross-linking urethane acrylate resin is obtained which has a viscosity of 200 Pas after it has been mixed with 200 g of hexanediol-1,6-diacrylate, and when tested as a 20 μm film on paper under the conditions described above, it attains a reactivity of 30 m/min.

EXAMPLE 13

100 g of an ethoxylated trimethylolpropane (OH number 550) are azeotropically esterified with 65 g (about 0.3 mol) of 3,4-methylene-dioxyphenyl-glyoxylic acid and 43 g (about 0.6 mol of acrylic acid and worked up, using a method analogous to that of Example 1.

A light coloured liquid having a viscosity of 1200 mPas/20° C. and an acid number of 3 is obtained.

The results are shown in Table 4.

EXAMPLE 14

100 g of an ethoxylated trimethylolpropane (OH number 550) are esterified with 70 g (about 0.33 mol) of 3,4-dimethoxy-phenyl-glyoxylic acid and 43 g (about 0.6 mol) of acrylic acid and worked up, using a method analogous to that of Example 1.

A light coloured liquid having a viscosity of 1200 mPas/20° C. and an acid number of 2 is obtained. The results are shown in Table 4.

EXAMPLE 15

The same procedure is employed as in Example 14 except that 61 g of 3-chlorophenyl-glyoxylic acid are used instead of 70 g of 3,4-dimethoxyphenyl-glyoxylic acid. A light coloured liquid having a viscosity of 500 mPas/20° C. and an acid number of 3 is obtained. The results are shown in Table 4.

EXAMPLE 16

The same procedure is employed as in the previous Examples except that 92 g (0.3 mol) of 4,7-dinitronaphthyl-glyoxylic acid-1 are used as the glyoxylic acid derivative.

A light coloured liquid with a viscosity of 1100 mPas/20° C. and an acid number of 4 is obtained. The results are shown in Table 4.

EXAMPLE 17

A phenyl-glyoxylic-methacrylic acid ester is prepared by the reaction of 100 g of an ethoxylated trimethylolpropane (OH number 550) with 50 g of phenylglyoxylic acid and 50 g (about 0.6 mol) of methacrylic acid by a method analogous to that of Example 1.

The product obtained on working up is a light coloured liquid with a viscosity of 900 mPas/20° C. and an acid number of 0.5. The results are shown in Table 4.

TABLE 4

20 g of each of the initiators from Examples 13 to 17 are mixed in each case with 80 g of the resin from Example 5 and the reactivity of the mixture is tested on a 20 μm film on paper as described above.

Results:

| Initiator Example | Reactivity m/min |
|---|---|
| 13 | 25 |
| 14 | 20 |
| 15 | 28 |
| 16 | 15 |
| 17 | 25 |

We claim:
1. A compound of the formula

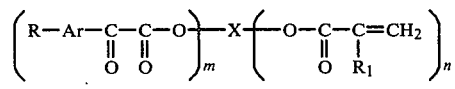

wherein
Ar is phenyl or naphthyl,
R is hydrogen, alkyl with 1-4 carbon atoms, alkoxy with 1-4 carbon atoms, halogen, dialkylamino with 1-4 carbon atoms in each alkyl group, carboxyl, or alkoxycarbonyl with 1-4 carbon atoms in the alkoxy group,
X is alkyl having 3 to 6 carbon atoms or alkyl having 6 to 72 carbon atoms interrupted by at least one member selected from the group consisting of $-O-$, $-S-$,

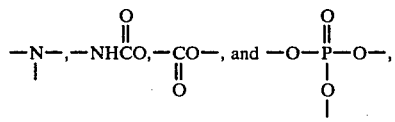

and the precursor of X being a polyol having 3-6 hydroxyls and having a hydroxyl number from 100 to 1850,
$R_1$ is hydrogen or methyl,
n is a number with a value from about 2 to about 5, and
n+m is a number with a value from about 3 to about 6.

2. A compound of claim 1, wherein
Ar is phenyl,
R is hydrogen,
X is alkyl having 3 to 6 carbon atoms or alkyl having 6 to 72 carbon atoms interrupted by at least one member selected from the group consisting of

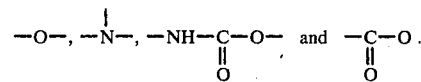

3. A compound according to claim 2, wherein
X is alkyl having 6 to 72 carbon atoms, interrupted at least once by $-O-$.

4. A compound of claim 1, wherein
Ar is phenyl,
R is hydrogen,
X is

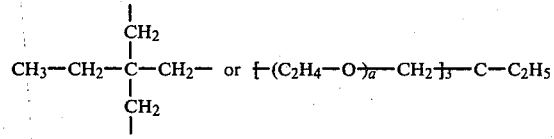

a is about 1 to about 4, n is about 2 and m+n is about 3.

5. A compound of the formula

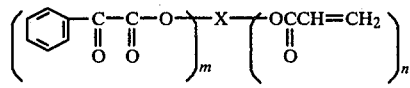

wherein m is about 1, n is about 2 and X is

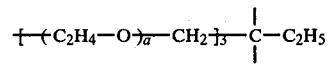

wherein a is about 1.3.

* * * * *